United States Patent

Carter

[15] 3,644,797

[45] Feb. 22, 1972

[54] SEMICONDUCTOR ASSEMBLY INCLUDING APERTURE-MOUNTED, DIAPHRAGM-SUPPORTED WAFER

[72] Inventor: Victor J. Carter, London, England

[73] Assignee: Westinghouse Brake English Electric Semi-Conductors Limited, London, England

[22] Filed: Apr. 21, 1970

[21] Appl. No.: 30,556

[30] Foreign Application Priority Data

Apr. 30, 1969 Great Britain ......................22,050/69

[52] U.S. Cl. ....................317/234 R, 317/234 E, 317/234 G, 317/234 P

[51] Int. Cl. ..........................................H01l 3/00, H01l 5/00

[58] Field of Search .......................317/234, 235, 1, 6, 11, 5; 174/52

[56] References Cited

UNITED STATES PATENTS

| | | | |
|---|---|---|---|
| 2,791,731 | 5/1957 | Walker et al. | 317/234 |
| 3,307,077 | 2/1967 | Bernstein | 317/235 |

FOREIGN PATENTS OR APPLICATIONS

| | | | |
|---|---|---|---|
| 1,049,981 | 11/1966 | Great Britain | 317/234 |
| 1,070,025 | 2/1954 | France | 317/234 |
| 341,234 | 11/1959 | Germany | 317/234 |

*Primary Examiner*—John W. Huckert
*Assistant Examiner*—Andrew J. James
*Attorney*—Larson, Taylor and Hinds

[57] ABSTRACT

A semiconductor assembly including a insulating planar body having a semiconductor wafer mounted in aperture extending between the major faces thereof. A pair of electrically and heat-conducting diaphragms hermetically sealed to the body close off the ends of aperture and support the wafer therewithin, the body itself extending beyond the peripheries of the diaphragms to prevent surface tracking. A conductor, including a first, tongue portion which extends into the aperture and a second portion, provides electrical contact with an inner region of the wafer. A pair of such assemblies is formed by mounting a second wafer in a second aperture in the body, and utilizing the second portion of the conductor of each assembly as one of the diaphragms of the other assembly.

10 Claims, 6 Drawing Figures

SEMICONDUCTOR ASSEMBLY INCLUDING APERTURE-MOUNTED, DIAPHRAGM-SUPPORTED WAFER

This invention relates to semiconductor devices.

The present invention provides a semiconductor device having a planar body which is of electrically insulating material and has opposed major faces in each of which is one end of an aperture extending through the body, a semiconductor wafer situated in the aperture and having opposed major faces, a first diaphragm of electrically and heat-conducting material hermetically sealed to one of the opposed major faces of the body and closing that end of the aperture in that major face, the side of the diaphragm facing the aperture being engaged by but not secured to one of the major faces of the wafer, a flanged member hermetically secured to the other of the opposed major faces of the body and encircling that end of the aperture in that other of the opposed major faces, and a second diaphragm hermetically secured by its periphery to the flange of the member, the second diaphragm being in electrical connection with but not secured to the other of the major faces of the wafer; the arrangement being such that the body extends outwardly beyond the peripheries of the two diaphragms and, in operation, adequate electrical and heat-transfer connection is effected between the wafer faces and the diaphragms by the application of a force across the diaphragms.

The flanged member may have a first flange by which the member is hermetically secured to the body and a second flange which constitutes the flange to which the second diaphragm is hermetically secured by its periphery.

The member and/or the first diaphragm may be hermetically secured to the body by solder.

There may be interposed between the flanged member and the body a conductor having a first tonguelike portion projecting inwardly of the aperture to lie between the second diaphragm and said other of the major faces of the wafer and providing electrical connection between that major face of the wafer and the second diaphragm, and a second portion projecting outwardly of the device thereby to provide an external electrical connection to the first portion.

The semiconductor wafer may have therein three regions of different conductivity type separated one from the other by a respective PN-junction one of which regions extends inwardly of the element from said one of the opposed major faces thereof and the other two of which regions both extend inwardly of the wafer from said other of the opposed major faces with a first of said two regions encircling the second of two regions, the first portion of the conductor then engaging only said first of said two regions of the element. With such an arrangement, the first portion of the conductor may have therethrough an aperture through which extends an electrical connection to the second of said two regions of the wafer. In this case, the second diaphragm may also have therethrough an aperture through which also extends the electrical connection. A tubular-shaped spacer may be provided which encircles the aperture of the second diaphragm, one end of the tubular-shaped spacer being hermetically sealed to the second diaphragm and the other end being hermetically closed by a connector between which and the second of two regions of the wafer extends the electrical connection. Conveniently, the electrical connection may be resiliently compressible, effective electrical contact then being capable of being made between the first diaphragm and said one of the opposed major faces of the wafer, said first portion of the conductor and the first of said two regions of the wafer and said electrical connection and said second of the two regions of the wafer, by the application of the force across the connector and the first diaphragm.

The body (and the spacer when provided) may be made, for example either of ceramic material or beryllia.

The present invention also provides a pair of semiconductor devices each of which is constructed in any one of the forms above specified, wherein the second portion of the conductor of each device constitutes the first diaphragm of the other device. Conveniently, with such an arrangement, the bodies of the two devices may be made integral one with the other to provide a single body. This single body may have therethrough apertures located outside the diaphragms to permit flow therethrough of a coolant fluid.

In order to length the creepage path over the surface of the body, the body may be provided with a peripheral flange.

The present invention further provides a stack of such pairs of devices wherein the pairs of devices are mounted one above the other and there is provided between each pair a lead arrangement which arrangements each have a pair of leads one of which is engaged with the connector of one device of a pair and the other of which is in contact with the diaphragm of one of the devices next below that pair in the stack, the leads being separated by spacers of electrically insulating material.

Embodiments of the present invention will now be described in greater detail, by way of example only, with reference to the accompanying drawings of which:

Figure 1:
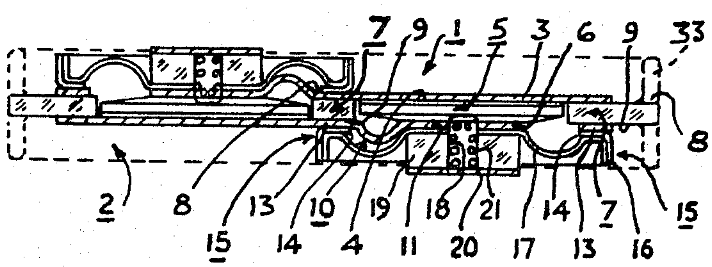
FIG. 1 is a cross-sectional view through a pair of devices.

Referring firstly, to FIG. 1, there is here shown a pair of devices 1 and 2 which are of basically identical construction and, therefore, of which the device 1 only will be described.

The device 1 comprises a first diaphragm 3 of electrical- and heat-conducting material (typically copper) which is engaged by the face 4 of a semiconductor wafer 5. The face 4 constitutes one of the two opposed major faces 4 and 6 of the semiconductor wafer 5. As shown in FIG. 1, the semiconductor wafer 5 is of conventional construction having therein two PN-junctions whereby the element is provided with three regions of different conductivity type separated one from the other by the respective one of the PN-junctions. As illustrated one of the regions extends inwardly of the wafer 5 from the face 4 and the other two regions extend inwardly of the wafer 5 from the face 6 with a first of the said two regions encircling the second of two regions.

The device 1 further comprises a planar body 7 having therethrough an aperture in which is positioned the wafer 5, the aperture terminating at each end in one of the opposed major faces 8 and 9 of the body 7.

The first diaphragm 3 is hermetically secured to the body 7 by being soldered to the face 8 thereof.

Figure 2:
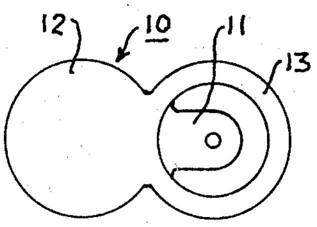
FIG. 2 is a plan view of the integral diaphragm of one device and the conductor of the other device.

Soldered to the face 9 of the body 7 is a conductor 10 which is of the configuration shown in FIG. 2. As can be seen from FIG. 2, the conductor 10 (which is of electrical-and-heat-conducting material such as copper) has a first tonguelike portion 11 and a second portion 12 which project respectively inwardly and outwardly of a third portion 13 by which the conductor is hermetically sealed by soldering to the body 7.

Returning to FIG. 1, there is soldered to the face of the conductor 10 opposite to that by which the conductor 10 is soldered to the body 7, a first flange 14 of a flanged member 15 to the other flange of which is hermetically sealed the periphery of a second diaphragm 17.

The central portion of the second diaphragm 17 engages the portion 11 of the conductor 10 and both the portion 11 and the central portion of the diaphragm 17 are provided, in that region, with an aperture 18. Surrounding the aperture 18 and soldered to the outer face of the central portion of the diaphragm 17 is a tubular spacer 19. The spacer 19 is of electrically insulating material (and may be, for example, of alumina ceramic or beryllia) and is closed at its outer end by a connector 20 between which and the second of the two regions extending inwardly of the wafer 5 from the face 6 thereof, is an electrical connection 21 in the form of a compression spring.

It will be appreciated that by the application of a compressive force across the connector 20 and the diaphragm 3, effective electrical contact will be made between the first diaphragm 3 and the face 4 of the semiconductor element 5, the portion 11 of the conductor 10 and the first of said two regions of the element 5, and the electrical connection 21 and the second of the two regions of the element 5.

Figure 3:
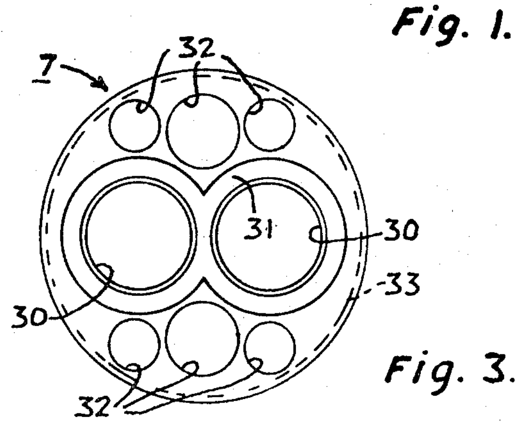
FIG. 3 is a plan view of the body.

As can be seen in FIG. 1, the device 1 constitutes one of a pair of devices 1 and 2 with, for each device, the portion 12 of its conductor 10 constituting the first diaphragm 3 of the other device. Moreover, it would be seen that the bodies 7 of the devices are integral one with the other to form a common single body. The common single body is of platelike configuration and is shown in plan view in FIG. 3. As can be seen from FIG. 3 the member has a pair of apertures 30 within which are located the respective semiconductor wafer 5 of FIG. 1; the region 31 surrounding these apertures being metallized for the purpose of having soldered thereto the peripheral area of the portion 12 (i.e., the diaphragm 3 of the other device) and the part 13 of the conductor 10.

Further apertures 32 are provided outside the peripheries of the diaphragms to provide passages through the body for cooling fluid and/or electrical connection.

In order to increase the creepage path over the face of the body and hence to decrease surface tracking, the body may be provided with a peripheral flange 33, as shown, more especially, in FIG. 1.

Figure 4:
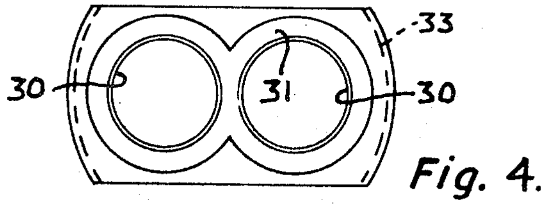
FIG. 4 is a plan view of an alternative construction of body.

In the alternative, the body may have the plan view configuration shown in FIG. 4 which is self-explanatory.

Figure 5:
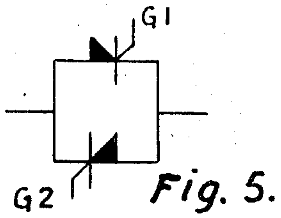
FIG. 5 is a circuit diagram of the electrical circuit provided by the pair of devices, and, FIG. 6 is a schematic view on a different scale of a stack of pairs of devices.

The pair of devices 1 and 2 provide an electrical circuit shown in diagrammatic form in FIG. 5 where the device 1 is shown, in FIG. 5, as the device with the suffix 1 and the device 2 is shown as the device with the suffix 2.

Figure 6:
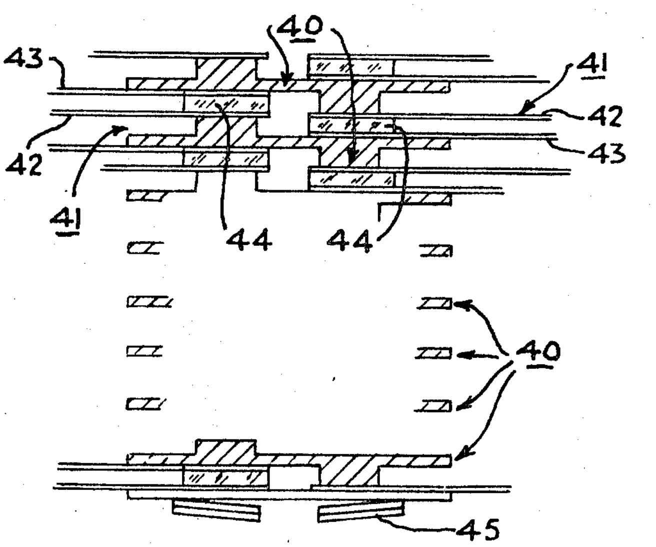

Pairs of devices as above described may be mounted in a stack as shown in FIG. 6 where the part 40 diagrammatically represent the pairs of devices 1 and 2 of FIG. 1.

Between each pair of devices is positioned a lead arrangement 41 each of which has a lead 42 engaging the conductor 20 of the respective device and a lead 43 engaging the diaphragm 3 of that device which is next in series in the stack above or below respectively the device the conductor 20 of which is engaged by the lead 42. The ends of the leads 42 and 43 between the devices, are separated by an insulator 44 and the whole stack is resiliently compressed by a Belleville washer 45 which is effective to apply across the devices a force to ensure adequate electrical and heat-transfer connection between the wafer faces and the diaphragms.

Having thus described our invention what we claim is:

1. A semiconductor assembly comprising a planar body fabricated of an electrically insulating material and including first and second opposed major faces, and an aperture extending through said body between said major faces, a semiconductor wafer located in said aperture and having first and second opposed major faces, a first diaphragm fabricated of electrically conducting and heat-conducting material, hermetically sealed to the first major face of said planar body to close the end of the aperture in that face, the side of said diaphragm facing inwardly toward said aperture being in unsecured electrically conducting engagement with the first major face of said wafer, a flanged member hermetically secured to the second major face of the said planar body and encircling the end of the aperture extending through said second face of said body, a second diaphragm hermetically secured along the periphery thereof to a flange of said flanged member, said second diaphragm being in unsecured electrically conducting engagement with the second major face of said wafer, said planar body extending outwardly beyond the peripheries of said first and second diaphragms to prevent surface tracking thereacross and said assembly enabling, in operation, adequate electrically conducting and heat-conducting connection between the faces of said wafer and said first and second diaphragms to be effected through the application of a force across the diaphragms.

2. An assembly as claimed in claim 1, wherein there is interposed between the flanged member and the body a conductor having a first tonguelike portion projecting inwardly of the aperture to lie between the second diaphragm and said second major face of the wafer and providing electrical connection between said second major face of the wafer and the second diaphragm, and a second portion projecting outwardly of the assembly thereby to provide an external electrical connection to the first portion.

3. An assembly as claimed in claim 2, wherein the wafer has therein three regions of different conductivity type separated one from the other by a respective PN-junction, one of which regions extends inwardly of the element from said one of the opposed major faces thereof and the other two of which regions both extend inwardly of the wafer from said other of the opposed major faces with a first of said two regions encircling the second of said two regions, the first portion of the conductor engaging only said first of said other two regions of the element.

4. An assembly as claimed in claim 3, wherein the first portion of the conductor has therethrough an aperture through which extends an electrical connection to the second of said two regions of the wafer.

5. An assembly as claimed in claim 4, wherein the second diaphragm also has therethrough an aperture through which also extends the electrical connection.

6. An assembly as claimed in claim 4, wherein a tubular-shaped spacer is provided which encircles the aperture of the second diaphragm, one end of the tubular-shaped spacer being hermetically sealed to the second diaphragm and the other end being hermetically closed by a connector between which and the second of said two other regions of the wafer extends the electrical connection.

7. A devices as claimed in claim 6, wherein the electrical connection is resiliently compressible, effective electrical contact then being capable of being made between the first diaphragm and said one of the opposed major faces of the wafer, said first portion of the conductor and the first of said two regions of the wafer, and said electrical connection and said second of the two regions of the wafer, by the application of the force across the connector and the first diaphragm.

8. An assembly as claimed in claim 1 wherein the body includes a peripheral flange.

9. An assembly as claimed in claim 2 in combination with a further said assembly, wherein the second portion of the conductor of each assembly constitutes the first diaphragm of the other assembly.

10. An assembly as claimed in claim 2 wherein said planar body includes a further said aperture, a further said semiconductor wafer being mounted in said aperture and said assembly further including a further said first diaphragm, a further said flange member, a further said second diaphragm, and a further said conductor, the second portion of the said further conductor constituting the first-mentioned first diaphragm and the second portion of the first-mentioned conductor constituting the further said first diaphragm.

* * * * *